United States Patent
Yang et al.

(10) Patent No.: US 9,934,858 B2
(45) Date of Patent: Apr. 3, 2018

(54) USE OF DUMMY WORD LINES FOR METADATA STORAGE

(71) Applicant: SANDISK TECHNOLOGIES LLC, Plano, TX (US)

(72) Inventors: Niles Yang, Mountain View, CA (US); Rohit Sehgal, Milpitas, CA (US); Abhilash Kashyap, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 113 days.

(21) Appl. No.: 14/700,500

(22) Filed: Apr. 30, 2015

(65) Prior Publication Data

US 2016/0322108 A1   Nov. 3, 2016

(51) Int. Cl.
| | |
|---|---|
| *G11C 11/34* | (2006.01) |
| *G11C 16/10* | (2006.01) |
| *G11C 11/56* | (2006.01) |
| *G11C 16/04* | (2006.01) |
| *G11C 16/28* | (2006.01) |
| *G11C 7/14* | (2006.01) |
| *G11C 16/08* | (2006.01) |
| *G11C 16/26* | (2006.01) |

(52) U.S. Cl.
CPC .............. *G11C 16/10* (2013.01); *G11C 7/14* (2013.01); *G11C 11/5628* (2013.01); *G11C 11/5642* (2013.01); *G11C 16/0483* (2013.01); *G11C 16/08* (2013.01); *G11C 16/26* (2013.01); *G11C 16/28* (2013.01); *G11C 2211/5641* (2013.01); *G11C 2211/5646* (2013.01)

(58) Field of Classification Search
CPC ......... G11C 16/10; G11C 16/08; G11C 16/26; G11C 7/14; G11C 16/28; G11C 11/5642; G11C 16/0483; G11C 11/5628; G11C 2211/5646; G11C 2211/5641
See application file for complete search history.

(56) References Cited

U.S. PATENT DOCUMENTS

| | | | |
|---|---|---|---|
| 2004/0177212 A1 | 9/2004 | Chang et al. | |
| 2010/0174845 A1 | 7/2010 | Gorobets et al. | |
| 2012/0117311 A1* | 5/2012 | Hong .................... | G06F 1/3275 711/103 |
| 2015/0277792 A1* | 10/2015 | Ma ......................... | G06F 3/0619 711/103 |
| 2016/0172046 A1* | 6/2016 | Moon ..................... | G11C 7/02 365/185.11 |

* cited by examiner

*Primary Examiner* — Mohammed A Bashar
(74) *Attorney, Agent, or Firm* — Foley & Lardner LLP

(57) ABSTRACT

In a non-volatile memories formed according to a NAND type of architecture, one or more of the end word lines on the source end, drain end, or both are set aside as dummy word lines that are not used to store user data. In addition to the host data, a memory system typically also stores metadata, or information about the user data, how it is stored and the memory system itself. Techniques are presented for using the dummy word lines of the memory blocks to hold this metadata. This arrangement allows for the metadata of a memory block to be known in real time, without reducing the storage capacity of the memory system.

23 Claims, 14 Drawing Sheets

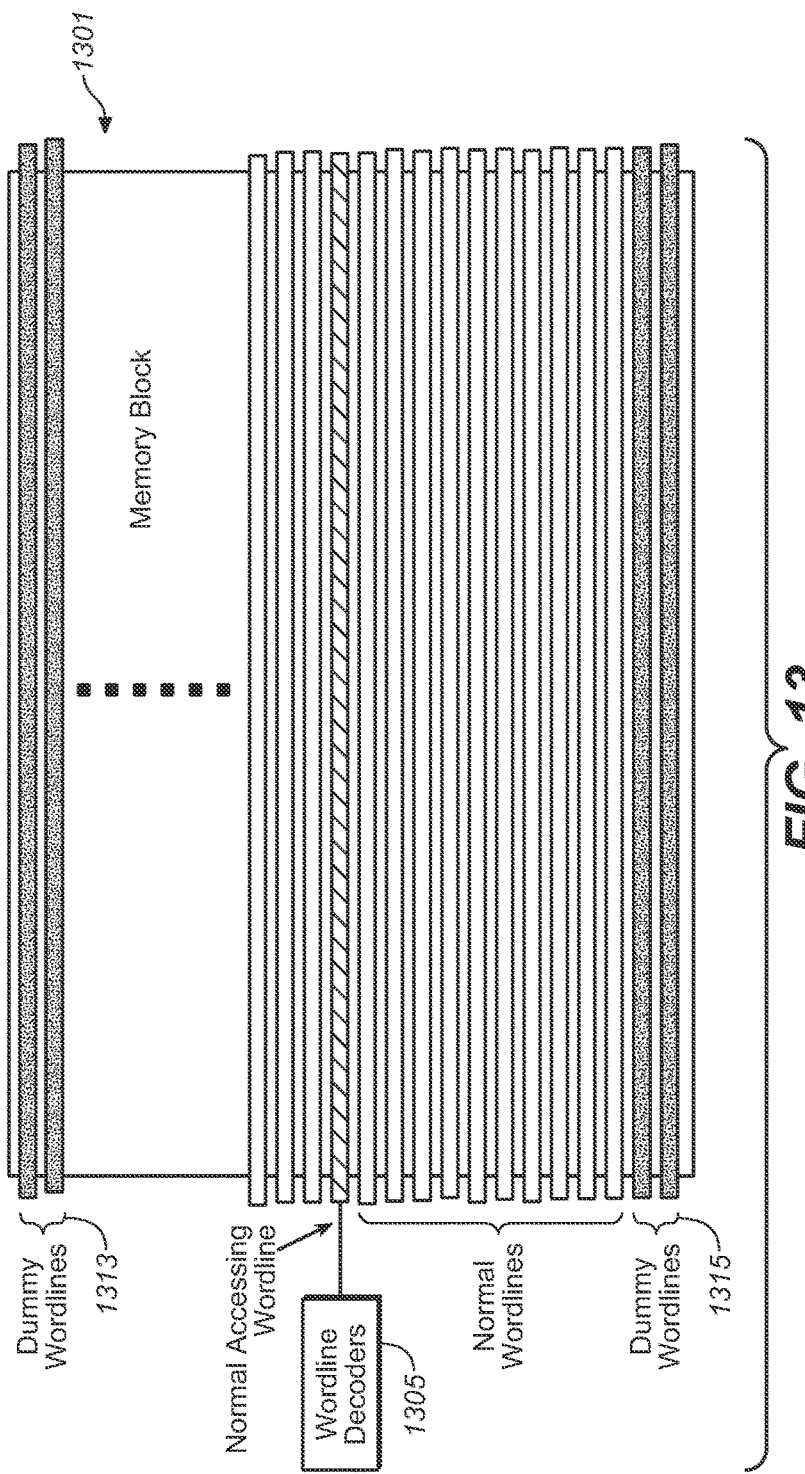

USE OF DUMMY WORD LINES FOR METADATA STORAGE

BACKGROUND

The following relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

Defects in a memory device will often occur as "cluster failures", where multiple physically adjacent blocks are completely bad or partially bad, so that all the blocks in the cluster result in some kind of error after data is written to these blocks. When selecting free blocks for a write operation, if the memory systems takes a number of free blocks from the area of the cluster failure, this can lead to repeated errors in the write process. Consequently, it would be useful to avoid such cluster failures when selecting free blocks for programming.

SUMMARY

Methods are presented for the operation of a non-volatile memory system, including a controller circuit and a memory circuit. The memory circuit has an array of non-volatile memory cells of one or more blocks each formed according to a NAND type architecture in which the memory cells are formed along word lines into NAND strings in which memory cells are serially connected between source and drain select gates. The word lines include a plurality of data word lines accessible for the storage of host data and one or more dummy word lines located between the data word lines and one or both of the source and drain select gates. The dummy word lines are not accessible for the storage of host data. The methods include: receiving one or more pages of data; writing the one or more pages of the received data onto one or more data word lines of a first block; and generating by the controller circuit of meta-data associated with the first block, the pages written into the first block, or both. The associated meta-data is written onto a first dummy word line of the first block.

Further methods are presented for the operation of a non-volatile memory system including a controller circuit and a memory circuit, where the memory circuit has an array of non-volatile memory cells of one or more blocks each formed according to a NAND type architecture in which the memory cells are formed along word lines into NAND strings in which memory cells are serially connected between source and drain select gates. The word lines include a plurality of data word lines accessible for the storage of host data and one or more dummy word lines located between the data word lines and one or both of the source and drain select gates, where the dummy word lines are not accessible for the storage of host data. A read request is received for one or more pages of data written onto one or more data word lines of a first block. Meta-data associated with the first block, the one or more pages data, or both, is subsequently read from a dummy word line of the first block. Subsequently the requested pages of data are read from one or more data word lines of a first block using parameters obtained from the meta-data associated with the first block.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications,

BRIEF DESCRIPTION OF THE DRAWINGS

FIG. 13 is a schematic representation of a memory block including dummy word lines.

FIG. 15 is an example of how the metadata could be laid out for writing onto a dummy word line.

DETAILED DESCRIPTION

Memory System

Figure 1:
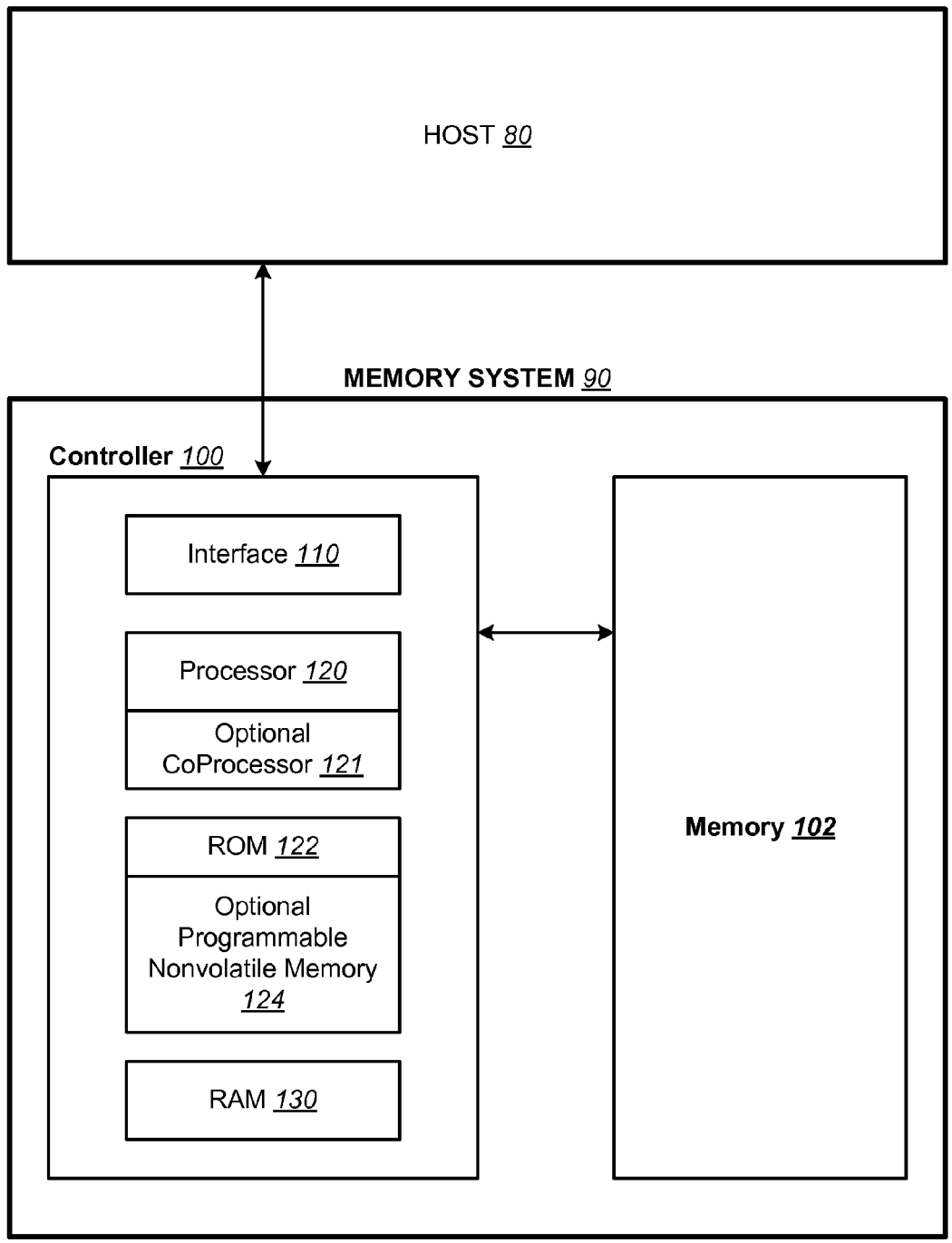
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
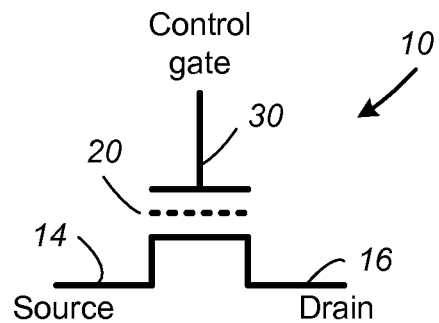
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
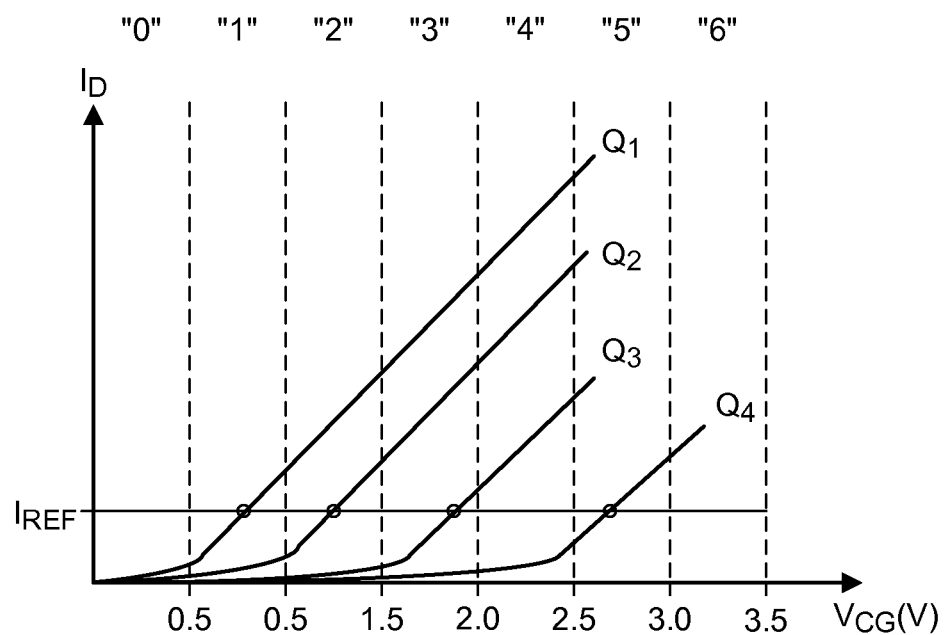
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
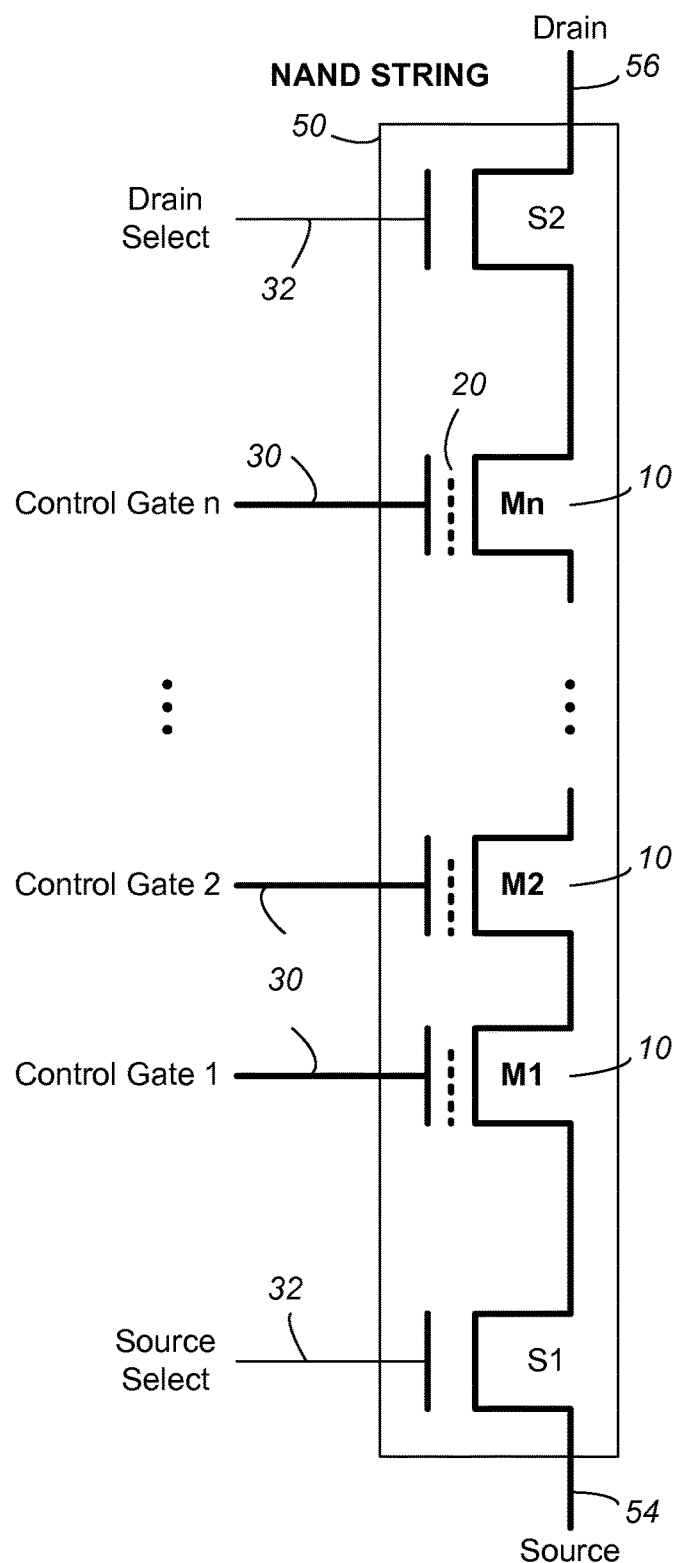
FIG. 4 illustrates schematically a string of memory cells organized into a NAND string.

FIG. 4 illustrates schematically a string of memory cells organized into a NAND string. A NAND string 50 comprises a series of memory transistors M1, M2, Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of a sufficient voltage on their control gates. In this way, a conductive path is effectively created from the source of the individual memory transistor to the source terminal 54 of the NAND string and likewise for the drain of the individual memory transistor to the drain terminal 56 of the cell.

FIG. 4B illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
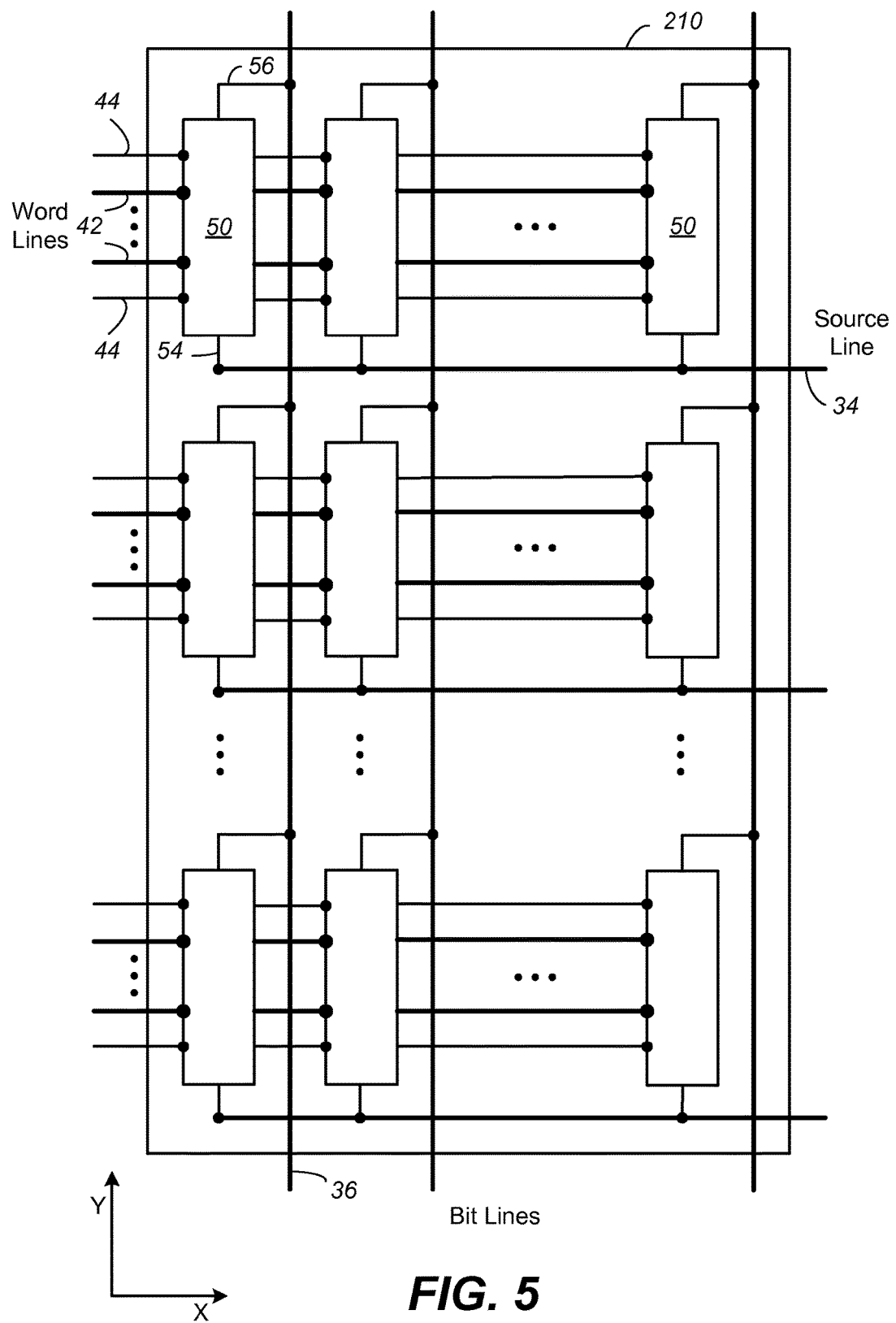
FIG. 5 illustrates an example of a NAND array 210 of memory cells, constituted from NAND strings 50 such as that shown in FIG. 4.
Figure 6:
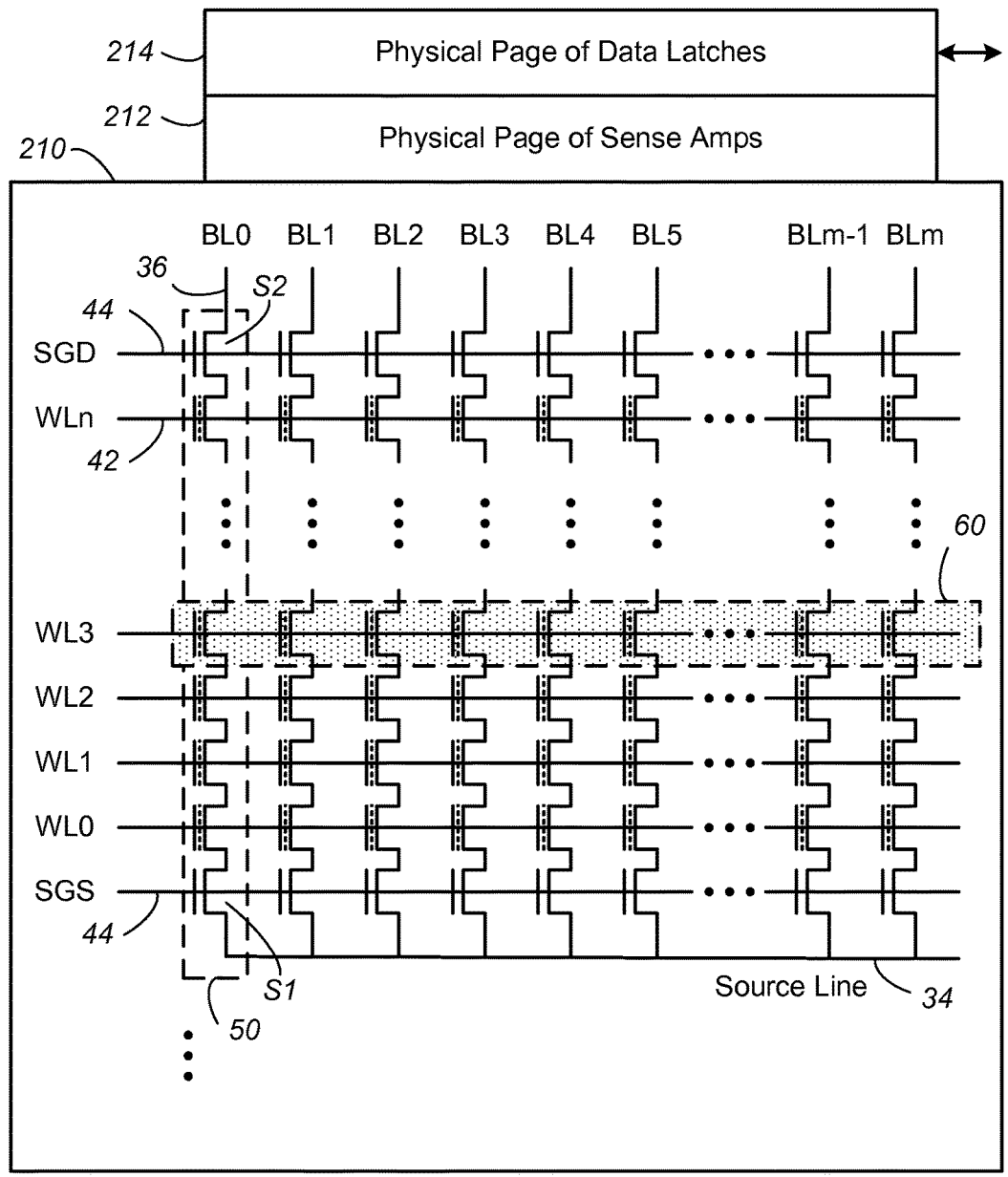
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-bit, Full-Sequence MLC Programming

Figure 7:
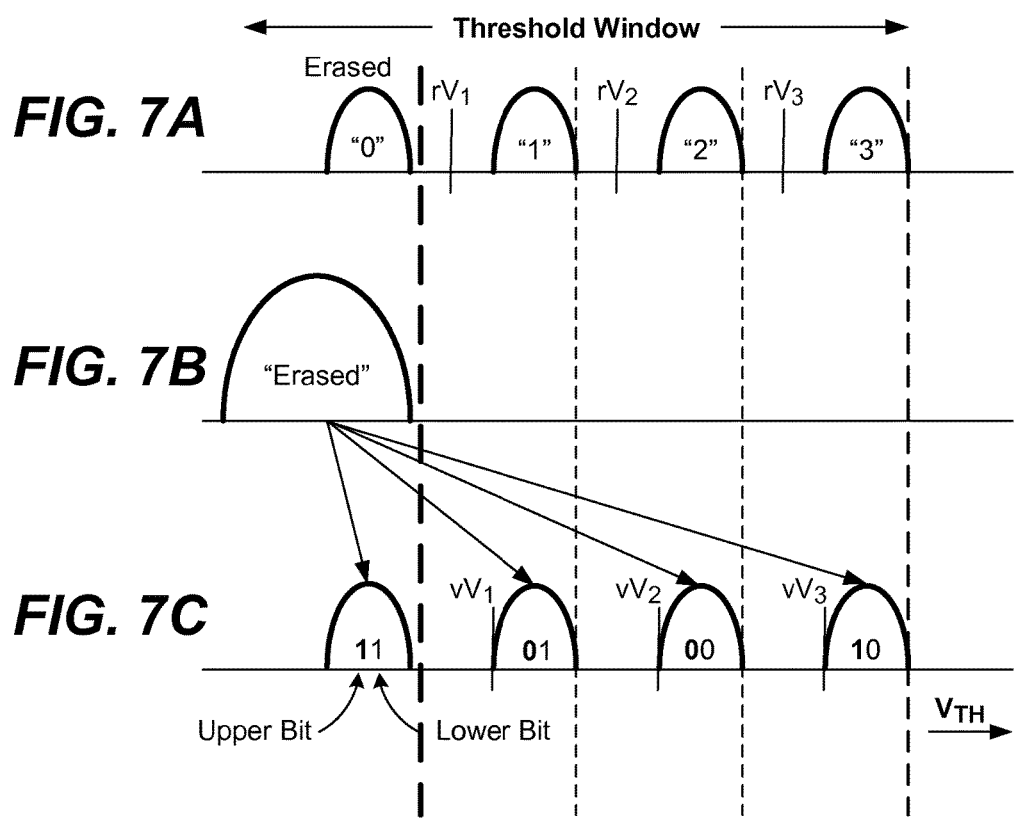
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
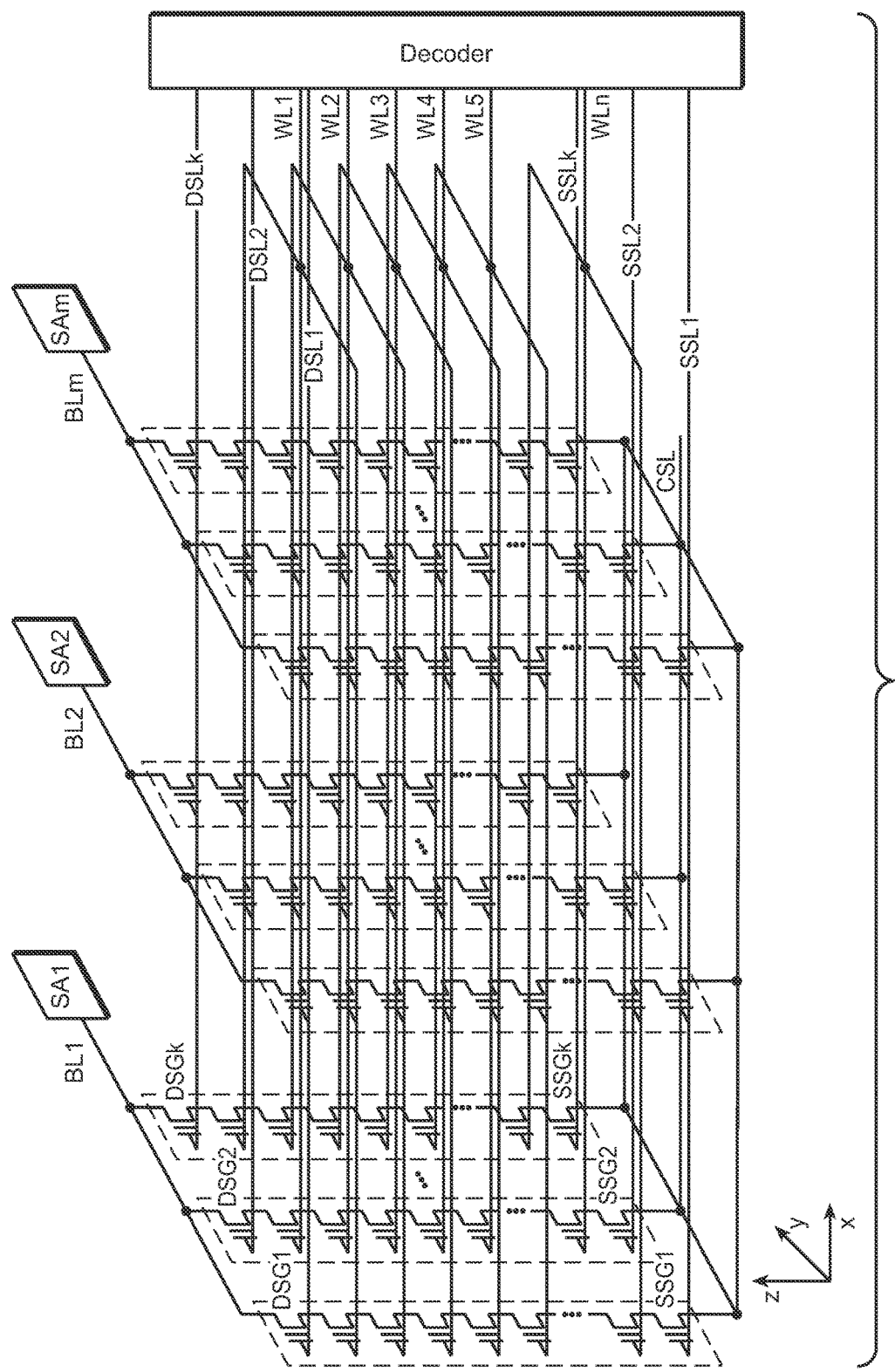
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-$m$, each run across the top to an associated sense amp SA1-$m$. The word lines, WL1-$n$, and source and select lines SSL1-$n$ and DSL1-$n$, then run in x direction, with the NAND string connected at bottom to a common source line CSL.

Figure 9:
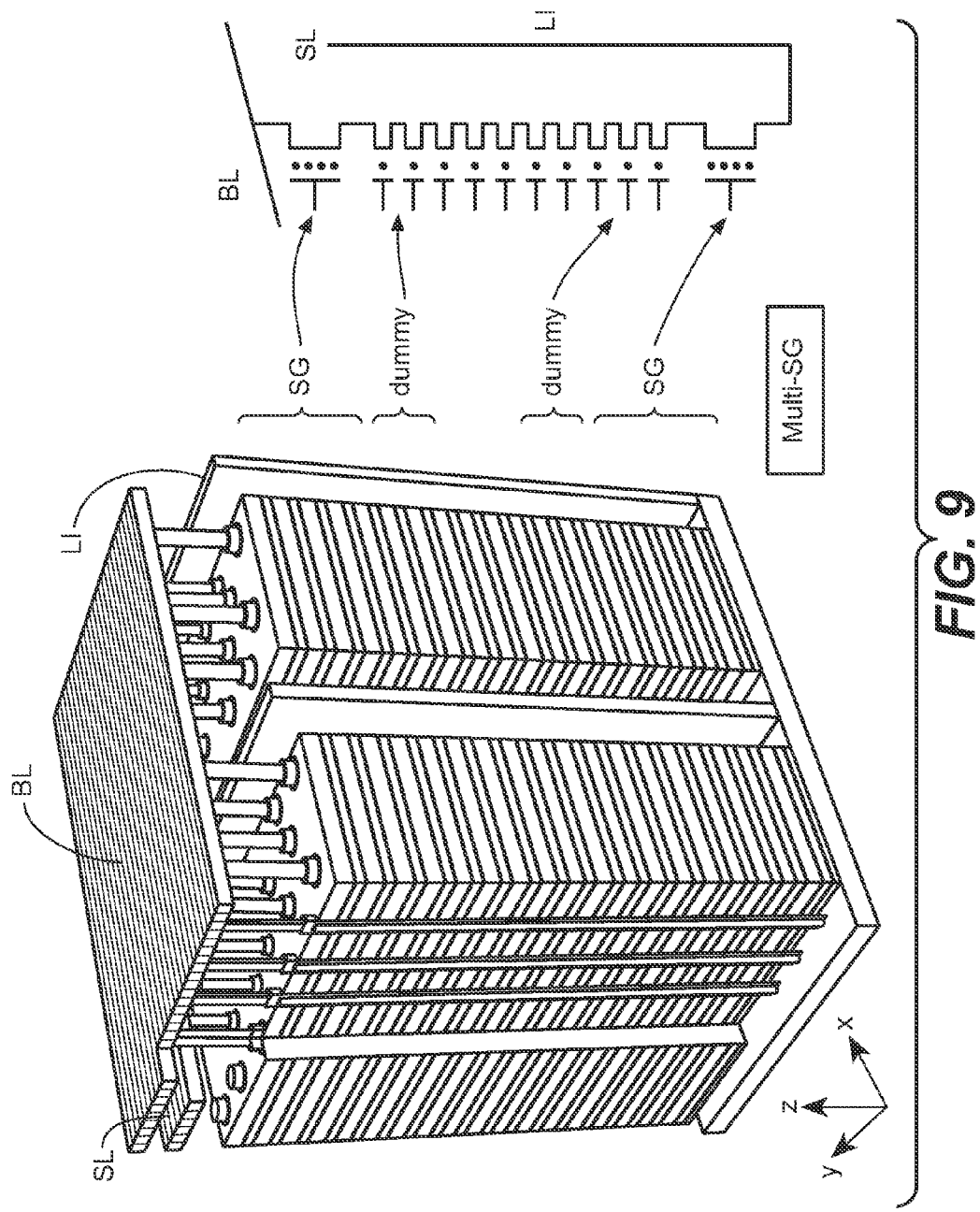
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL.

It is often useful to have a select gate with a greater length than that of memory cells, where this can alternately be achieved by having several select gates in series, making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
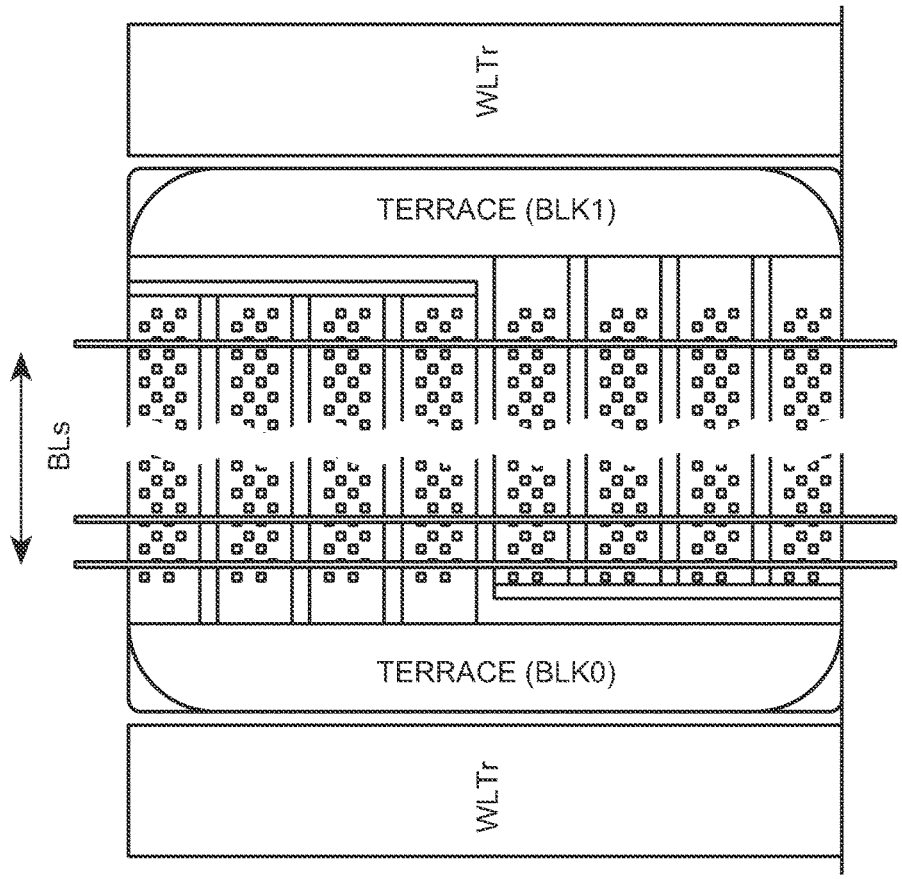

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
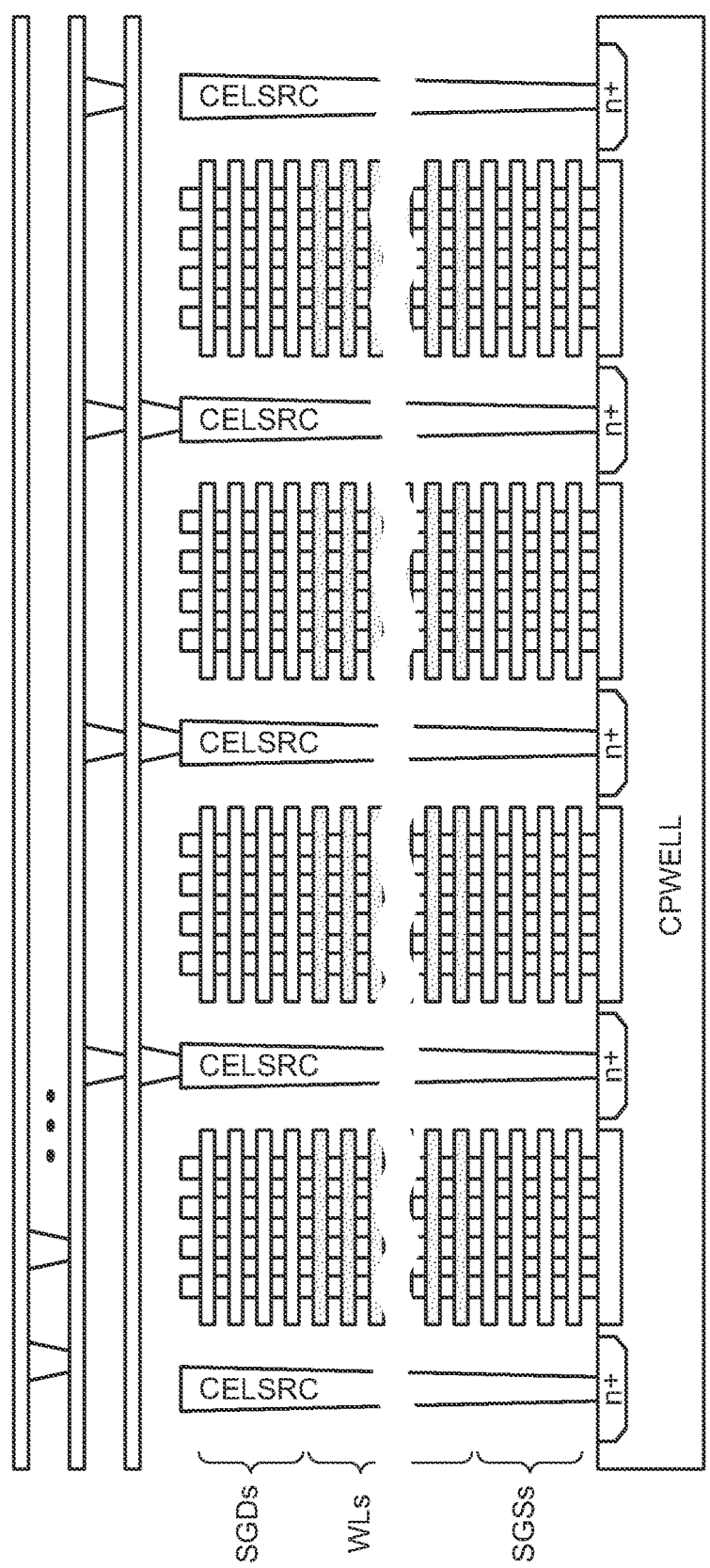

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
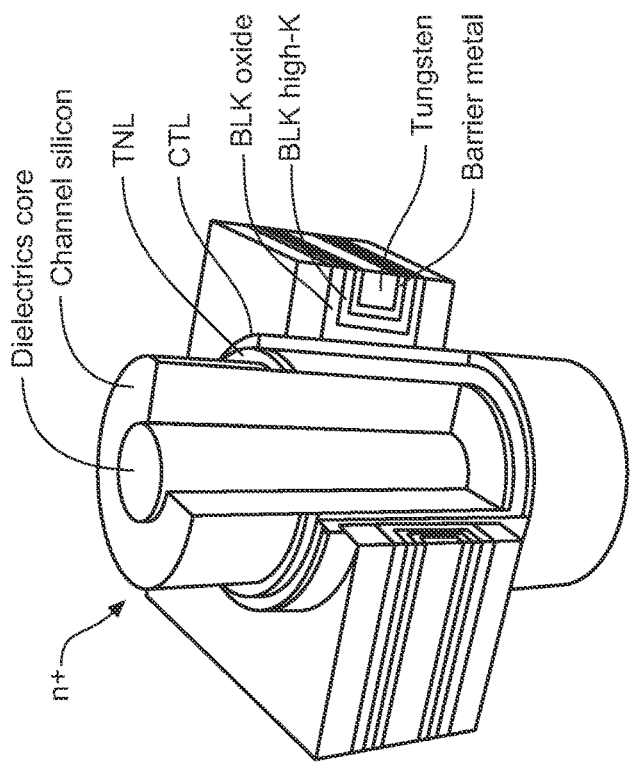

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Dummy Word Lines

Whether for 2D arrays, such as illustrated with respect to FIGS. 5 and 6, or the 3D structures illustrated with respect FIGS. 8-12, are prone to shifts in their threshold levels, known as disturbs, due to operations are other cells of the array. This is particularly true to the cells along word lines adjacent to the select gates. Because of this, it is common to set aside one or more word lines on the source side, drain side, or typically both as dummy word lines. The dummy word lines are not used for storing data, but rather serve as a buffer zone between the select gates and the memory cells. As such, they need not be programmed to a particular one of the data state, but usually some sort of intermediate level (e.g., the "2" or "00" state in the 4state, 2-bit example of FIGS. 7A and 7C. Consequently, the dummy word lines can be operated in the binary mode, even the data word lines are multi-state. Additionally, the distribution of the thresholds need not be tight as for the user data, both as it is binary and also as data corruption is not a concern.

The dummy word lines are not accessible for the storage of host data, treated as being outside of the addressable memory space and not seen from the outside. The access to the dummy word lines can be through internal "test modes"

of the memory circuit, involving a special command sequence given to the chip to enable its internal circuitry to access the dummy word lines. This command to access the dummy word lines can be given by the controller to the memory, assuming that the firmware run on the controller knows the command sequence as part of the code. Usually, the firmware information is hidden from the user of the memory system and if not told, a user would not be able to decipher the firmware and this command; that is, a host would not know how to access the dummy word lines as it is not part of the decoding space of which the host is aware.

Metadata

In addition to the host data, memory systems typically also store metadata, or information about the data, how it is stored and the memory system itself. For example, the metadata can include information on a block's status (such as if it is open, or closed, or bad), history of a block, parameters relating to read and write operations, logical block address, and so on. The controller will usually want access to the corresponding metadata when operating on a block, as well as to accurately gauge the memory block's status and take appropriate actions to better access and use these blocks. Due to limited controller RAM, all of this metadata cannot be maintained on the controller during memory system operation and usually must be loaded from the non-volatile memory, slowing down memory operations and using up memory space.

Use of Dummy Word Lines for Metadata Storage

This section presents techniques that allow the metadata of a memory block to be known in real time, storing the signature of a block to track the time, history (effects of data retention and read disturb), bit error rate (BER) evolution, data temperature, operation conditions, trim parameters, and other metadata without sacrificing the system's capacity and the memory's capacity. The metadata can be obtained in order to accurately gauge the memory block status and take appropriate actions to better access and use these blocks within the memory system's limited resources such as processing ability, RAM, time, and computation complexity. The techniques of this section handle these issues by providing a system based memory block metadata storage solution. More specifically, the dummy word lines of the memory blocks are used to hold this information.

Under precious approaches, these problems are often addressed based on empirical equations, such as those based on a block's number of program erase cycles, which are subject to the vulnerability of measuring the memory cell behaviors such as BER, handled by the adaptive trimming and adaptive wear leveling. Also, other solutions include cell threshold voltage (Vt) distribution (CVD) tracking of the Vt distribution, the dynamic reads, and adaptive programming voltage (VPGM), in order to gauge and change the condition of the block after multiple trial reads or by using the predetermined write levels.

As the nonvolatile memory cell scales to smaller dimensions, the overall reliability of the memory cells become worse and directly affects the data integrity at both memory and system levels. In order to increase the memory system's endurance and performance, it is desirable to have the memory capable of adjusting its own optimum operating parameters for read, program and erase to better meet the system requirements. The system needs to have the capability of setting up the operating parameters accordingly. Every block has its own characteristics. Therefore it is preferred to have the metadata, such as time and operating condition, stored for the specific block such that the block or block-group have their own optimum operating conditiona.

One way to track the block or block-group behavior is to use a paticular representative wordline of the block which is convenient to access and can represent the data retention (DR), program/erase count (PIE), read disturb (RD) parameters of the block, but preferably without sacrificing the block's data storage capacity. The examplary embodiments do this by using the dummy word lines for this data.

More specifically, the exemplary embodiment programs one or more of the dummy word lines with a block's associated metadata. As the dummy word lines are not used for the storage of user data, whether from the host or system data, this does not reduce the block's data storage capacity. The user data can be stored in a multi-state, or MLC, format, while the metadata can be written on to the dummy word lines in either binary, or SLC, format or a MLC format. A binary SLC format will typically provide sufficient capacity while making the metadata faster to read and write as well as more robust. As the metadata is stored non-volatilely with the user data in the same block, it can be readily accessed for any needed metadata as part of accessing the block for user data.

FIG. 13 is a schematic representation of a memory block 1301 of NAND memory, whether of the 2D or a 3D variety, where the source end can be taken as at the bottom and the drain end at top. The select gates are not shown, but the word lines run left to right. This example has a pair of dummy word lines 1313 on drain end and a pair 1315 on the source side. The word line decoding circuitry is represented schematically at 1305 connected for accessing of a typical (non-dummy) word line. The same decoder circuity can be used for the both dummy and user-data word lines, but with a special mode used to access the dummy word lines. When writing the word lines of a block, it is typically to write sequentially from one end (such as the source) to the other, although variations exist that jump around to avoid inter-word line coupling effects (Yupin effect). Similarly, NAND memory is typically accessed in a sequential manner. The metadata can be placed on any the dummy word lines, or some combination of these. As the full metadata content may depend on the write process for the user data, it may be preferable to place this on the drain side dummy word lines as the final writes usually occur on that end, although the memory can come back at the end of writing the block or later and enter in or update the meta-data on either end's dummy word lines.

Figure 14:
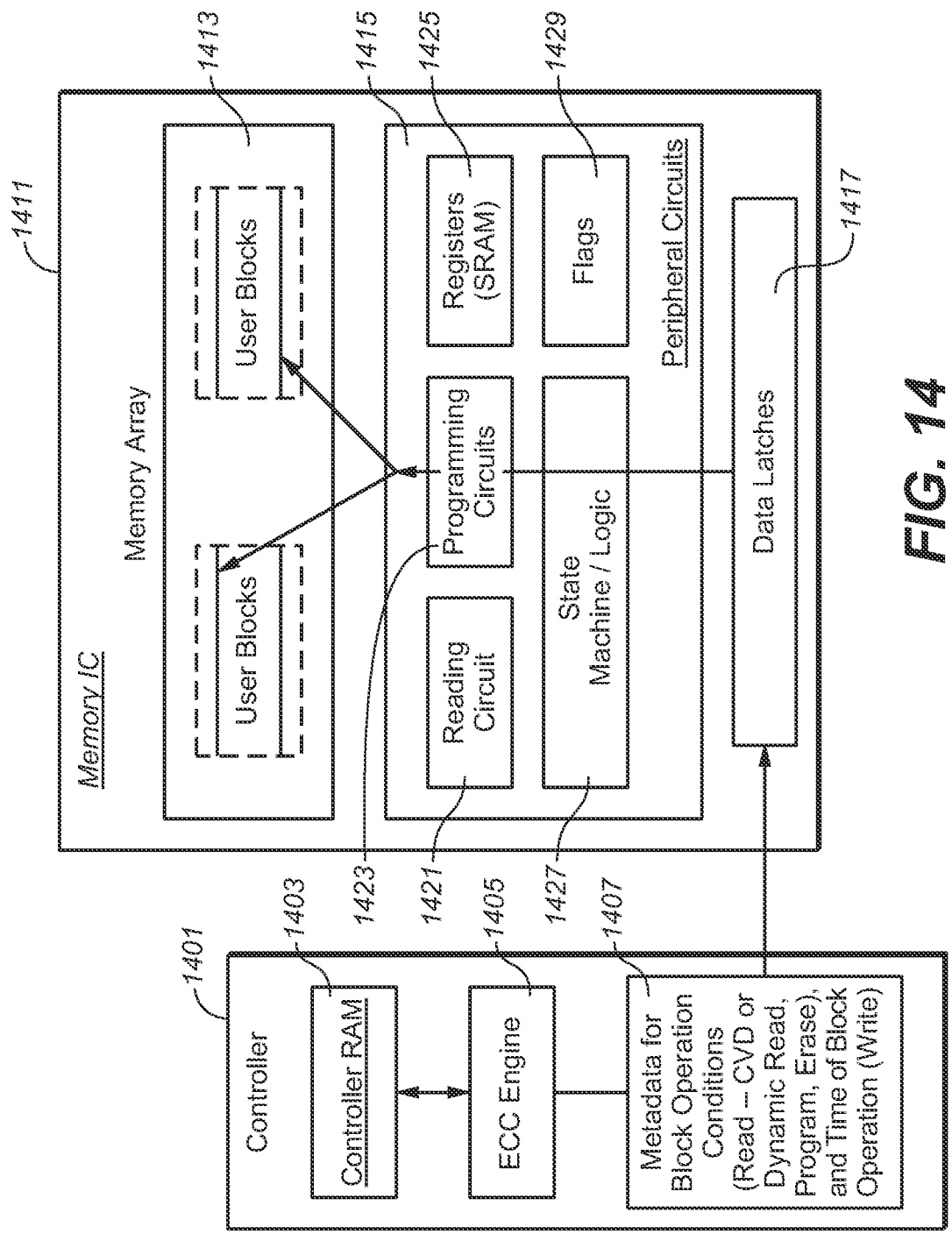
FIG. 14 is a block diagram of some the overall structure for the system with dummy word line metadata storage.

FIG. 14 is a block diagram of some the overall structure for the system with dummy word line metadata storage, and is similar to memory system 90 of FIG. 1, but with different components highlighted. The explicitly represent elements of the controller 1401 includes RAM memory 1403, an ECC engine 1405, and then a block 1407 to represent the various logic/processor sections of the controller. The block 1407 generates the metadata such as for the various block operation conditions (such as cell threshold voltage distributions (CVD) and dynamic parameters related to read, program and erase) and the time of block operations, such as when the block was written. These metadata can then be transferred over to one of the memory chips to be written on a dummy word line or lines of the associated block.

The memory integrated circuit 1411 include an array 1413, in which two user blocks are shown along with a source and a drain dummy word line for each. The peripheral circuitry 1415 can include the various reading circuits 1421, programming circuits 1415, some SRAM memory 1415 for registers, flag storage 1429, and a state machine/logic block 1427 to oversee on-chip operations. The metadata is transferred from the controller 1401 over to the data latches 1417 and then written into dummy word lines of the corresponding blocks, as represented by the arrows. The enabling of the metadata writing can precede the user data writing, which can be implemented similarly between regular word lines and dummy word lines. The enabling command can be based on a special testmode used to access the dummy word line, not used for other operations, and not accessible by the host.

FIG. 15 is an example of how the metadata could be laid out for writing onto a dummy word line. In a typical arrangement, a single page of data can hold enough content to store a block's associated metadata on a single dummy word line in a binary, SLC format. The exemplary metadata includes: information on the block type, such as whether it is open (not fully written), closed, or defective; a timestamp, such as when the block was written so that the age of the data can be determined, for purposes such as determining possible deterioration or how hot/cold the data is for wear leveling or scrub purposes; read parameters, such as would be applied in dynamic read processes; adaptive trimming parameters, such as would be used in programming or other operations; the number of error correction code (ECC) parity bits with which the user data is encoded; the logical address of the block, for address conversion; an indication of a known data pattern, such as would be used in data retention (DR) or read disturb (RD) determinations; and indicators of block health, such as bit error rates, the number of program-erase cycles, and so on.

Figure 16:
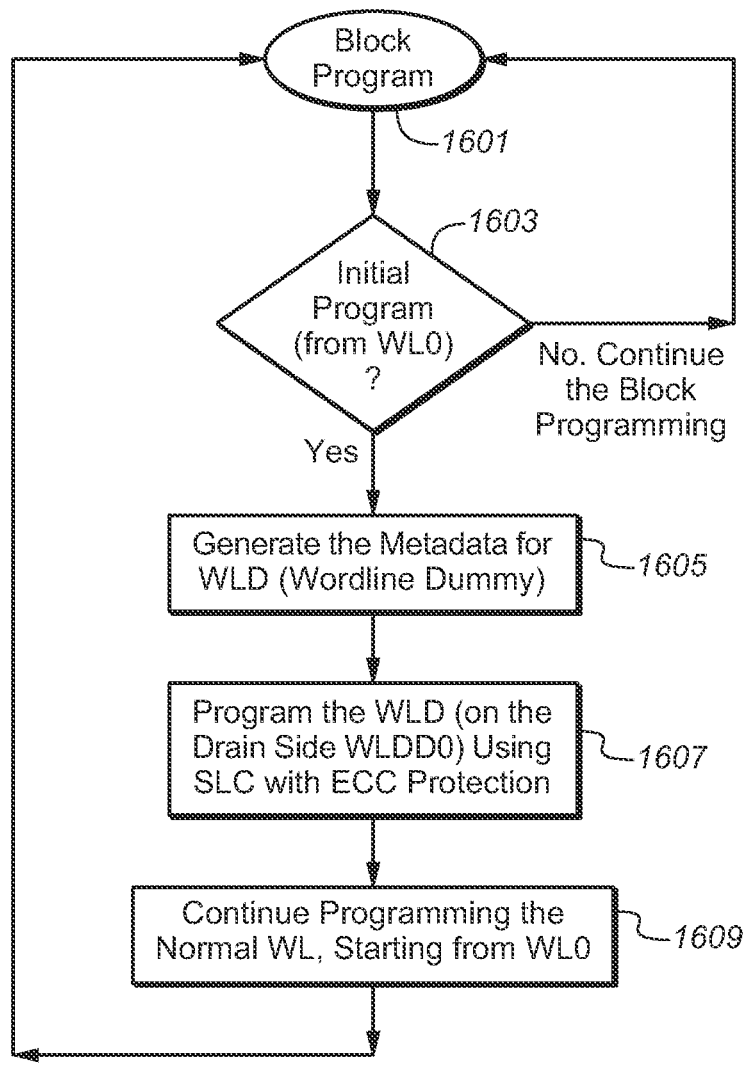
FIG. 16 is an example of a block program flow to write the dummy word lines with metadata.
Figure 17:
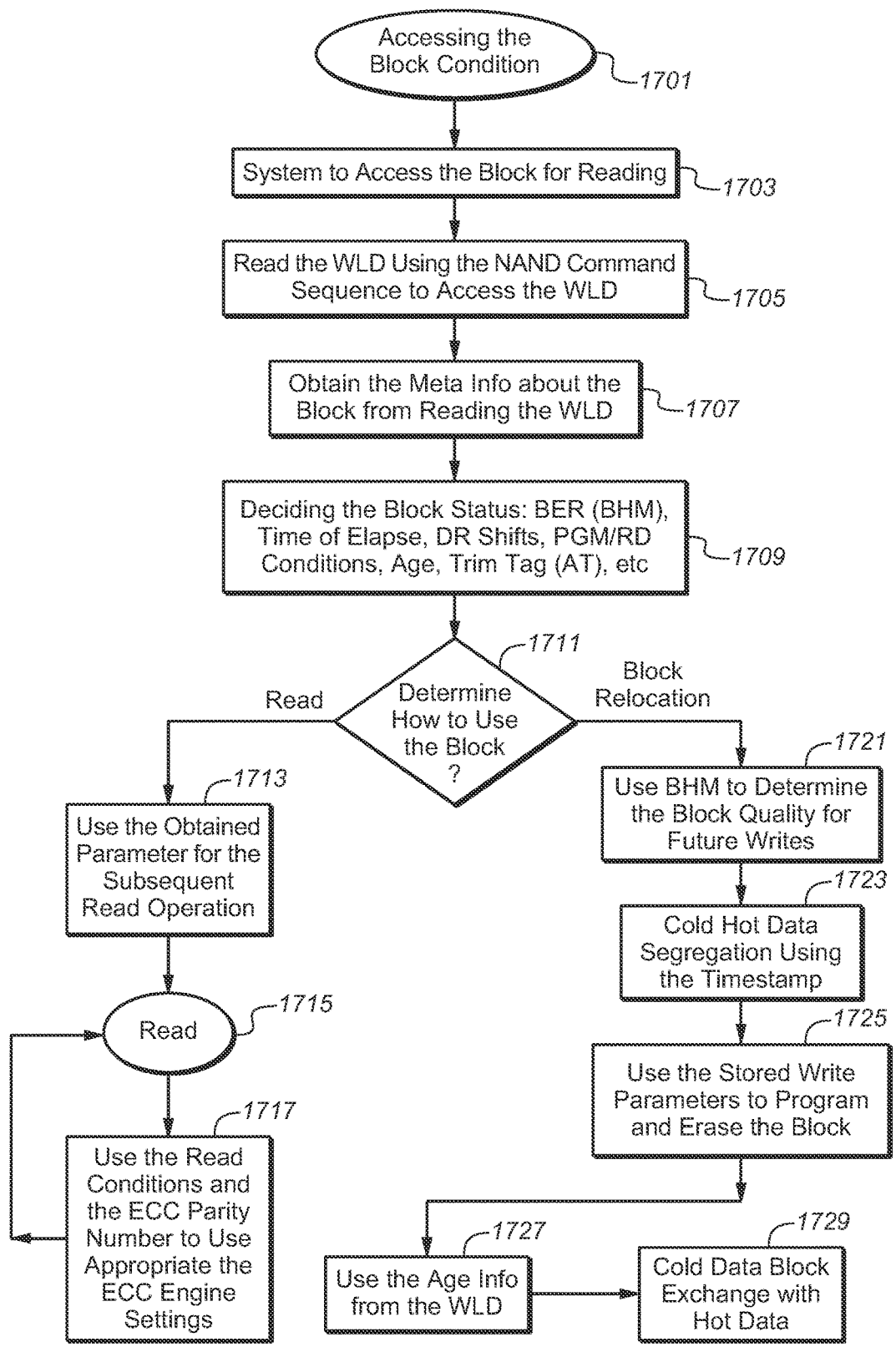
FIG. 17 shows an exemplary flow chart of the retrieving the metadata from the dummy word line and how to adjust the system operating condition accordingly.

FIGS. 16 and 17 are examples of one set of sequence flows to write the dummy word lines with metadata and use it for the subsequent operation. A block program flow begins at 1601 with writing in pages of data, with a determination at 1603 of whether this is initial program at word line 0 (WL0) in the order. If not, the flow loops back to 1601 and the block's programming continues; if so, the block's associated metadata for writing to a dummy word line is generated at 1605. The metadata is then transferred over to the memory and programmed onto a dummy word line (such as the first of the source side dummy word lines, WLDD0) at 1607. The metadata can be written using an SLC-like (binary format) programming scheme and can be protected with ECC, if desired, that can be generated on the controller from the metadata and then transferred over as ECC code words. Once the metadata is programmed, the programming of the normal word lines can continue, starting at word line 0 at 1609, before looping back to 1601. At the end of the block programming the block can be assigned information on the block's health and this can be stored in the word line dummy too. Such updating of the metadata can be done by partial page programming.

FIG. 17 shows an exemplary flow chart of the retrieving the metadata from the dummy word line and how to adjust the system operating condition accordingly. Assessing of the selected block's condition begins at 1701, with block being accessed for reading at 1703. The system reads the dummy word line at 1705 using a specific command sequence from the controller for accessing the dummy word line. This allows the controller to obtain the metadata about the block at 1707 and decide at 1709 on the block's status. Factors contributing to these decisions can include: the bit error rate (BER) or other "block heath meter" (BHM); the time elapsed since the block was written or last accessed (timestamp); shifts in dynamic read (DR) levels; program or read disturb conditions; age of data; adaptive trim tags; and other metadata. Based on these parameters, a determination on how to use the block can then be made at 1711.

If the decision is to read, the obtained parameters can then be used for the subsequent read (1713), with the read sequence beginning at 1715. The read process then loops through the selected pages of the block at 1715, using the read conditions and the ECC parity number to use the appropriate settings in the ECC engines.

If the decision at 1711 is instead for block relocation, at 1721 the "block health meter" information can be used to determine block quality for future writes. The blocks data content can then be classified as hot (frequently rewritten) or cold (infrequently rewritten) based on the timestamp at 1723. This information can then be used is wear levelling by reassigning blocks based on a segregation of data in cold and hot (or finer gradations) categories. More detail on this sort of wear leveling is given in US patent publication number US 2010-0174845 or US 2004-0177212. When a block exchange is to be made between a cold data block and a hot data block relevant parameters for program and erase can be retrieved from the metadata at 1725, as can the block's age data at 1727, with the cold data block exchange with hot data performed at 1729.

Any of these embodiments allow for the fast assessment of the memory device and of operating condition tuning for optimum operations. The exemplary process is internal to the memory system, controlled by the controller, and is hidden from the host, making use of the dummy word lines that are not seen by the host and otherwise unused. The controller is allowed to internally access these dummy word lines, for both writing and reading, through use of associated write and read commands that provide the needed access.

CONCLUSION

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto It is claimed:

1. A method comprising:
receiving a read request for one or more pages of data written onto a first block of a non-volatile memory system comprising a controller circuit and a memory circuit, the memory circuit comprising a plurality of blocks, each of the plurality of blocks comprising a plurality of non-volatile memory cells formed along word lines into NAND strings in which the plurality of non-volatile memory cells are serially connected between source and drain select gates, the word lines comprising one or more data word lines accessible for storage of host data and one or more dummy word lines located between the one or more data word lines and one or both of the source and drain select gates for storing meta-data, wherein the one or more dummy word lines are not accessible for the storage of the host data, and wherein the non-volatile memory system stores data accessible on the one or more data word lines in a multi-state format using multi-level cell (MLC) and stores meta-data accessible on the one or more dummy word lines in a binary format using single level cell (SLC);

subsequently reading the meta-data associated with the first block, with the one or more pages of data, or with both of the first block and the one or more pages of data, from a first dummy word line of the one or more dummy lines of the first block; and subsequently reading the one or more pages of data from the one or more data word lines of the first block using parameters obtained from the meta-data associated with the first block.

2. The method of claim 1, further comprising:
subsequent to reading the meta-data associated with the first block, determining whether to perform a data relocation operation on the first block based upon the meta-data.

3. The method of claim 1, wherein the first dummy word line is accessed for reading through a specific command sequence generated by the controller circuit.

4. The method of claim 1, wherein the one or more pages of data include data received from a host and system data generated by the controller circuit.

5. The method of claim 1, wherein the first dummy word line is located between the one or more data word lines and the drain select gates.

6. The method of claim 1, wherein the meta-data includes specifying block status.

7. The method of claim 1, wherein the meta-data includes an indication of when the first block was written.

8. The method of claim 1, wherein the meta-data includes parameter values for use in a sensing operation.

9. The method of claim 1, wherein the meta-data includes parameter values for use in a programming operation.

10. The method of claim 1, wherein the meta-data includes a number of error correction code parity bits with which the one or more pages of data are encoded.

11. The method of claim 1, wherein the meta-data includes a measure of health of the first block.

12. The method of claim 1, wherein the memory circuit is a monolithic three-dimensional semiconductor memory device having the plurality of non-volatile memory cells arranged in multiple physical levels above a silicon substrate and the word lines running in a horizontal direction relative to the substrate.

13. A non-volatile memory system, comprising:
a memory circuit comprising:
a plurality of blocks, each of the plurality of blocks having a plurality of non-volatile memory cells formed along word lines into NAND strings in which the plurality of non-volatile memory cells are serially connected between source and drain select gates, the word lines comprising:
a plurality of data word lines accessible for storage of host data; and
one or more dummy word lines located between the plurality of data word lines and one or both of the source and drain select gates for storing meta-data, wherein the one or more dummy word lines are not accessible for the storage of host data, and wherein the memory circuit stores data accessible on the one or more data word lines in a multi-state format using multi-level cell (MLC) and stores meta-data accessible on the one or more dummy word lines in a binary format using single level cell (SLC); and a controller, wherein, in response to receiving a read request for one or more pages of data written onto a first block of the plurality of blocks, the controller issues the memory circuit a command to read from a first dummy word line of the one or more dummy word lines of the first block the meta-data associated with the first block, with the one or more pages of data, or with both of the first block and the one or more pages of data, and issues the memory circuit another command to read the one or more pages of data from one or more of the plurality of data word lines of the first block using parameters obtained from the meta-data associated with the first block.

14. The non-volatile memory system of claim 13, wherein subsequent to reading the meta-data associated with the first block, the controller determines whether to perform a data relocation operation on the first block based upon the meta-data.

15. The non-volatile memory system of claim 13, wherein the first dummy word line is accessed for reading through a specific command sequence generated by the controller.

16. The non-volatile memory system of claim 13, wherein the one of more pages of data include data received from a host and system data generated by the controller.

17. The non-volatile memory system of claim 13, wherein the first dummy word line is located between the plurality of data word lines and drain select gates.

18. The non-volatile memory system of claim 13, wherein the meta-data includes specifying block status.

19. The non-volatile memory system of claim 13, wherein the meta-data includes an indication of when the first block was written.

20. The non-volatile memory system of claim 13, wherein the meta-data includes parameter values for use in a sensing operation.

21. The non-volatile memory system of claim 13, wherein the meta-data includes parameter values for use in a programming operation.

22. The non-volatile memory system of claim 13, wherein the meta-data includes a number of error correction code parity bits with which the one or more pages of data are encoded.

23. The non-volatile memory system of claim 13, wherein the memory circuit is a monolithic three-dimensional semiconductor memory device having the plurality of non-volatile memory cells arranged in multiple physical levels above a silicon substrate and the word lines running in a horizontal direction relative to the substrate.

* * * * *